United States Patent
Nguyen et al.

(10) Patent No.: US 7,132,140 B2
(45) Date of Patent: Nov. 7, 2006

(54) PLURAL METALLIC LAYERS IN OLED DONOR

(75) Inventors: Kelvin Nguyen, Rochester, NY (US); Donald R. Preuss, Rochester, NY (US); Lee W. Tutt, Webster, NY (US); Michael L. Boroson, Rochester, NY (US); Giana M. Phelan, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 281 days.

(21) Appl. No.: 10/855,679

(22) Filed: May 27, 2004

(65) Prior Publication Data

US 2005/0266186 A1    Dec. 1, 2005

(51) Int. Cl.
*B41M 5/40* (2006.01)
*H05B 33/00* (2006.01)
*H01L 51/50* (2006.01)

(52) U.S. Cl. .................... 428/32.77; 428/690; 428/917
(58) Field of Classification Search ............. 428/32.77, 428/690, 917; 313/504, 506
See application file for complete search history.

(56) References Cited

U.S. PATENT DOCUMENTS

| | | |
|---|---|---|
| 5,688,551 A | 11/1997 | Littman et al. |
| 5,725,989 A | 3/1998 | Chang et al. |
| 5,851,709 A | 12/1998 | Grande et al. |
| 6,114,088 A | 9/2000 | Wolk et al. |
| 6,140,009 A | 10/2000 | Wolk et al. |
| 6,214,520 B1 | 4/2001 | Wolk et al. |
| 6,221,553 B1 | 4/2001 | Wolk et al. |
| 6,703,184 B1 | 3/2004 | Preuss et al. |
| 6,790,594 B1 | 9/2004 | Preuss et al. |
| 2002/0160296 A1 | 10/2002 | Wolk et al. |

FOREIGN PATENT DOCUMENTS

EP    1 028 001    8/2000

*Primary Examiner*—Dawn L. Garrett
(74) *Attorney, Agent, or Firm*—Raymond L. Owens (57) ABSTRACT

A donor element for transferring organic material to form an OLED device includes a transparent support, a first metallic layer responsive to radiation which passes through the transparent support to produce heat, a second metallic layer that is reactive to moisture or oxygen or both provided over the first metallic layer, and an organic layer having transferable organic material disposed over the second metallic layer which, in response to radiation absorbed by the first metallic layer, will cause the organic material to be transferred to an OLED device.

12 Claims, 1 Drawing Sheet

PLURAL METALLIC LAYERS IN OLED DONOR

CROSS REFERENCE TO RELATED APPLICATIONS

Reference is made to commonly assigned U.S. patent application Ser. No. 10/393,033 filed Mar. 20, 2003 by Donald R. Preuss, et al., entitled "A High Absorption Donor Substrate Coatable With Organic Layer(s) Transferrable in Response to Incident Laser Light", commonly assigned U.S. Patent Publication No. 2005/0266152 filed concurrently herewith by Kelvin Nguyen et al., entitled "Depositing An Organic Layer For Use in OLEDs", and commonly assigned U.S. Patent Publication No. 2005/0266172 filed concurrently herewith by Kelvin Nguyen et al., entitled "Linear Laser Light Beam for Making OLEDs", the disclosures of which are incorporated herein by reference.

FIELD OF THE INVENTION

The present invention relates to OLED display devices and the fabrication thereof.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can include one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electron transport layer (for electron transport). In forming the RGB pixels in a full-color OLED display panel, it is necessary to devise a method to precisely pattern the emissive layer of the organic EL medium or the entire organic EL medium.

A suitable method for patterning high resolution OLED displays has been disclosed in commonly assigned U.S. Pat. No. 5,851,709 by Grande et al. This method is comprised of the following sequences of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color-forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. Another problem is the requirement for precision mechanical alignment between the donor substrate and the display substrate. A further problem is that the donor pattern is fixed and cannot be changed readily.

Littman and Tang, in commonly assigned U.S. Pat. No. 5,688,551, teach the patternwise transfer of organic EL material from an unpatterned donor sheet to an EL substrate. A series of patents by Wolk et al., U.S. Pat. Nos. 6,114,088, 6,140,009, 6,214,520, and 6,221,553, teach a method that can transfer the luminescent layer of an EL device from a donor element to a substrate by heating selected portions of the donor with a laser beam. Each layer is an operational or nonoperational layer that is utilized in the function of the device.

In these processes a donor containing the electroluminescent materials is heated by radiation and transferred to a receiver, which can already contain a portion of the active device. The device can then be finished by the application of further layers. There is a continuing need for improved lifetime from such devices.

SUMMARY OF THE INVENTION

It is therefore an object of the present invention to provide an OLED device prepared by radiation thermal transfer with improved lifetime.

This object is achieved by a donor element for transferring organic material to form an OLED device, comprising:
  a) a transparent support;
  b) a first metallic layer responsive to radiation which passes through the transparent support to produce heat;
  c) a second metallic layer that is reactive to moisture or oxygen or both provided over the first metallic layer; and
  d) an organic layer having transferable organic material disposed over the second metallic layer which, in response to radiation absorbed by the first metallic layer, will cause the organic material to be transferred to an OLED device.

Advantages

It is an advantage of this method that it provides an OLED device with improved lifetime that can be prepared by radiation thermal transfer from a donor element.

DETAILED DESCRIPTION OF THE INVENTION

The term "OLED device" or "organic light-emitting display" is used in its art recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full-color" is commonly employed to describe multicolor display panels that are capable of emitting in the red, green, and blue regions of the visible spectrum and displaying images in any combination of hues. The red, green, and blue colors constitute the three primary colors from which all other colors can be produced by appropriate mixing. However, the use of additional colors to extend the color gamut of the device is possible. The term "pixel" is employed in its art recognized usage to designate an area of a display panel that can be stimulated to emit light independently of other areas. However, it is recognized that in full-color systems, several pixels of different colors will be used together to produce a broad range of colors, and a viewer can term such a group a single pixel.

Figure 1:
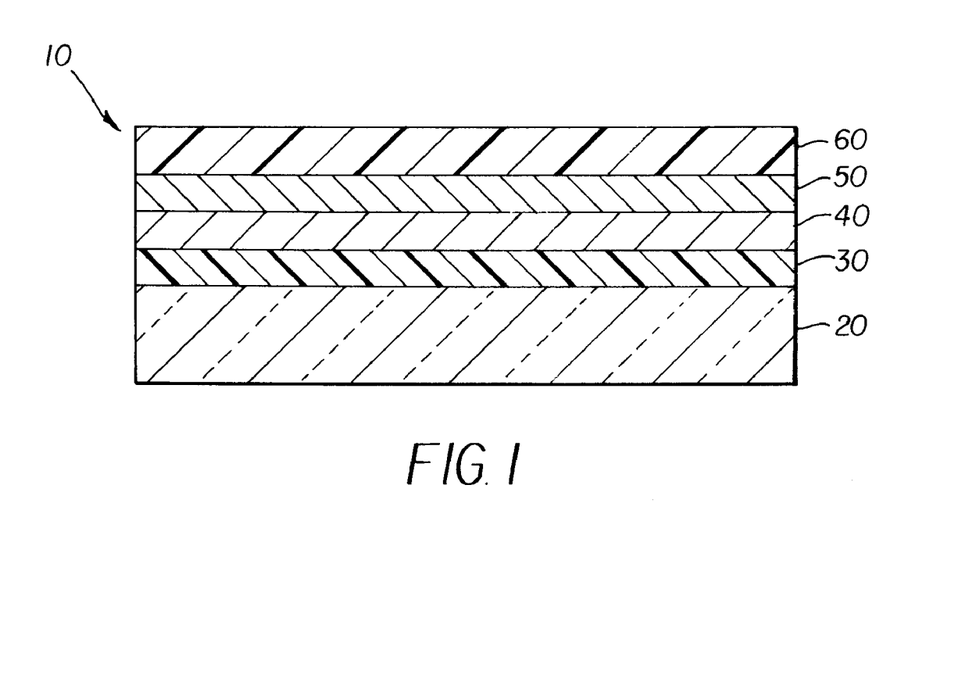
FIG. 1 shows a cross-sectional view of a donor element in accordance with this invention.

Turning now to FIG. 1, there is shown a donor element that can be used in accordance with this invention. Donor element 10 includes transparent support 20, first metallic layer 40, second metallic layer 50, and organic layer 60. Donor element 10 can also optionally include antireflection layer 30.

Transparent support 20 can be made of any of several materials which meet at least the following requirements: The donor support must be capable of maintaining the structural integrity during the light-to-heat-induced transfer step while pressurized on one side, and during any preheating steps contemplated to remove volatile constituents such as water vapor. Additionally, the donor support must be capable of receiving on one surface a relatively thin coating of organic donor material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. Some examples include polyimide, polysulfone, polyetherimide, polyvinylidinefluoride or polymethylpentene, or mixtures thereof. While selection of suitable support materials can rely on known engineering approaches, it will be appreciated that certain aspects of a selected support material merit further consideration when configured as a donor support useful in the practice of the invention. For example, the support can require a multistep cleaning and surface preparation process prior to precoating with transferable organic material. For this invention, it is most useful if the transparent support is less than 200 micrometers thick.

If the support material is a radiation-transmissive material, the incorporation into the support or onto a surface thereof, of a radiation-absorptive material can be advantageous to more effectively heat the donor support and to provide a correspondingly enhanced transfer of transferable organic emissive material from the support to the substrate, when using a flash of radiation from a suitable flash lamp or laser light from a suitable laser. In such a case, transparent support 20 is first uniformly coated with first metallic layer 40 capable of absorbing radiation in a predetermined portion of the spectrum to produce heat. First metallic layer 40 can be a metal such as Ag, Au, Be, Co, Cr, Cu, Fe, Ir, Mo, Nb, Ni, Pt, Rh, Ta, Pd, V, or W, or mixtures thereof. Preferred metals from this group are Be, Cr, V, Mo, Pt, or W, or mixtures thereof.

Antireflection layer 30 is an optional layer in donor element 10 and comprises a material having the real portion of its index of refraction greater than 3.0. This includes materials such as silicon, germanium, and combinations thereof. Particularly useful combinations of antireflection layer 30 and first metallic layer 40 include silicon with chromium, and germanium with nickel. The use of an antireflection layer, and the process of matching an effective antireflection layer with a first metallic layer, has been described in commonly assigned U.S. patent application Ser. No. 10/393,033 filed Mar. 20, 2003 by Donald R. Preuss, et al., entitled "A High Absorption Donor Substrate Coatable With Organic Layer(s) Transferrable in Response to Incident Laser Light", the disclosure of which is herein incorporated by reference.

Second metallic layer 50 was coated on top of the first metallic layer 40 to react with moisture and/or oxygen on the surface of the first metallic layer 40. It is a desired feature to have no moisture and/or oxygen on the surface of first metallic layer 40 because moisture and/or oxygen can degrade organic layer 60 and therefore give poor device performance. Second metallic layer 50 includes a metal that is reactive towards moisture and/or oxygen such as Al, Ba, Ca, Co, Cr, Fe, K, Li, Mg, Mn, Na, Ni, Sc, Sr, Ti, and V. Additionally, second metallic layer 50 comprises a different metal than first metallic layer 40. It is preferred to have the second metallic layer 50 include a metal with a first ionization potential of less than 7 eV. Second metallic layer 50 can be deposited onto first metallic layer 40 by an evaporative method shortly before coating organic layer 60.

Donor element 10 can include as a transferable layer an organic material for forming a useful layer in an OLED device, e.g. a hole-transporting material, a light-emitting material, an electron-transporting material, or some combination.

Hole-transporting materials useful in an OLED device are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A

A wherein:

Q$_1$ and Q$_2$ are independently selected aromatic tertiary amine moieties; and

G is a linking group such as an arylene, cycloalkylene, or alkylene group of a carbon-to-carbon bond.

In one embodiment, at least one of Q$_1$ or Q$_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B where:
R$_1$ and R$_2$ each independently represent a hydrogen atom, an aryl group, or an alkyl group or R$_1$ and R$_2$ together represent the atoms completing a cycloalkyl group; and
R$_3$ and R$_4$ each independently represent an aryl group, which is in turn substituted with a diaryl substituted amino group, as indicated by structural Formula C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D wherein:
each Are is an independently selected arylene group, such as a phenylene or anthracene moiety;
n is an integer of from 1 to 4; and
Ar, R$_7$, R$_8$, and R$_9$ are independently selected aryl groups.

In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms, e.g. cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:
1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]$_p$-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4''-diamino-p-terphenyl;
4,4'-Bis {N-phenyl-N-[4-(1-naphthyl)-phenyl] amino}biphenyl;
2,6-Bis[N,N-di(2-naphthyl)amino]fluorene;
4,4',4''-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Some hole-injecting materials described in EP 0 891 121 A1 and EP 1 029 909 A1 can also make useful hole-transporting materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. A light-emitting layer can be comprised of a single material, but more commonly includes a host doped with a guest compound or dopant where light emission comes primarily from the dopant. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

The host and emitting materials can be small nonpolymeric molecules or polymeric materials including polyfluorenes and polyvinylarylenes, e.g., poly(p-phenylenevinylene), PPV. In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the bandgap of the dopant is smaller than that of the host material. For phosphorescent emitters, including materials that emit from a triplet excited state, i.e. so called "triplet emitters", it is also important that the triplet energy level of the host be high enough to enable energy transfer from host to emitting material.

Host and emitting molecules known to be of use include, but are not limited to, those disclosed in U.S. Pat. Nos. 4,768,292, 5,141,671, 5,150,006, 5,151,629, 5,294,870, 5,405,709, 5,484,922, 5,593,788, 5,645,948, 5,683,823, 5,755,999, 5,928,802, 5,935,720, 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine[alias, tris(8-quinolinolato)aluminum(III)];
CO-2: Magnesium bisoxine[alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato)aluminum(III);
CO-5: Indium trisoxine[alias, tris(8-quinolinolato)indium];
CO-6: Aluminum tris(5-methyloxine)[alias, tris(5-methyl-8-quinolinolato)aluminum(III)];
CO-7: Lithium oxine[alias, (8-quinolinolato)lithium(I)];
CO-8: Gallium oxine[alias, tris(8-quinolinolato)gallium (III)]; and
CO-9: Zirconium oxine[alias, tetra(8-quinolinolato)zirconium(IV)].

The host material in one or more of the light-emitting layers of this invention can be an anthracene derivative having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red

F wherein $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

The monoanthracene derivative of Formula (I) is also a useful host material capable of supporting electroluminescence, and are particularly suitable for light emission of wavelengths longer than 400 nm, e.g., blue, green, yellow, orange or red. Anthracene derivatives of Formula (I) is described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference, (I)

wherein:

R₁–R₈ are H; and

R₉ is a naphthyl group containing no fused rings with aliphatic carbon ring members; provided that R₉ and R₁₀ are not the same, and are free of amines and sulfur compounds. Suitably, R₉ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, R₉ is 2-naphthyl, or 1-naphthyl substituted or unsubstituted in the para position; and R₁₀ is a biphenyl group having no fused rings with aliphatic carbon ring members. Suitably R₁₀ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, R₁₀ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula (II):

A1-L-A2 (II)

wherein A 1 and A 2 each represent a substituted or unsubstituted monophenylanthryl group or a substituted or unsubstituted diphenylanthryl group and can be the same with or different from each other and L represents a single bond or a divalent linking group.

Another useful class of anthracene derivatives is represented by general formula (III):

A3-An-A4 (III)

wherein An represents a substituted or unsubstituted divalent anthracene residue group, A 3 and A 4 each represent a substituted or unsubstituted monovalent condensed aromatic ring group or a substituted or unsubstituted non-condensed ring aryl group having 6 or more carbon atoms and can be the same with or different from each other. Specific examples of useful anthracene materials for use in a light-emitting layer include:

Benzazole derivatives (Formula G) constitute another class of useful host materials capable of supporting electroluminescence, and are particularly suitable for light emission of wavelengths longer than 400 nm, e.g., blue, green, yellow, orange or red where:

n is an integer of 3 to 8;

Z is O, NR or S;

R' is hydrogen; alkyl of from 1 to 24 carbon atoms, for example, propyl, t-butyl, heptyl, and the like; aryl or heteroatom-substituted aryl of from 5 to 20 carbon atoms for example phenyl, naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2, 2',2''-(1,3,5-phenylene)-tris[1-phenyl-1H-benzimidazole].

Certain of the hole-transporting materials described above, e.g. 4,4'-bis[N-(1-naphthyl)-N-phenylamino]biphenyl and 4,4'-bis[N-(2-naphthyl)-N-phenylamino]biphenyl, can also be useful hosts for one or more of the light-emitting layers of this invention.

Suitable host materials for phosphorescent emitters, including materials that emit from a triplet excited state, i.e. so called "triplet emitters", should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, 01/39234 A2, 01/93642 A1, 02/074015 A2, 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-(N,N'-dicarbazole)biphenyl, m-(N,N'-dicarbazole)benzene, and poly(N-vinylcarbazole), including their derivatives.

Desirable host materials are capable of forming a continuous film. The light-emitting layer can contain more than one host material in order to improve the device's film morphology, electrical properties, light emission efficiency, and lifetime. The light-emitting layer can contain a first host material that has effective hole-transporting properties, and a second host material that has effective electron-transporting properties.

Desirable fluorescent dopants for OLED displays commonly include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds. Illustrative examples of dopants include, but are not limited to, the following:

L1

L2

L3

L4

L5

L6

-continued

| | X | R1 | R2 | | X | R1 | R2 |
|---|---|---|---|---|---|---|---|
| L9 | O | H | H | L23 | O | H | H |
| L10 | O | H | Methyl | L24 | O | H | Methyl |
| L11 | O | Methyl | H | L25 | O | Methyl | H |
| L12 | O | Methyl | Methyl | L26 | O | Methyl | Methyl |
| L13 | O | H | t-butyl | L27 | O | H | t-butyl |
| L14 | O | t-butyl | H | L28 | O | t-butyl | H |
| L15 | O | t-butyl | t-butyl | L29 | O | t-butyl | t-butyl |
| L16 | S | H | H | L30 | S | H | H |
| L17 | S | H | Methyl | L31 | S | H | Methyl |
| L18 | S | Methyl | H | L32 | S | Methyl | H |
| L19 | S | Methyl | Methyl | L33 | S | Methyl | Methyl |
| L20 | S | H | t-butyl | L34 | S | H | t-butyl |
| L21 | S | t-butyl | H | L35 | S | t-butyl | H |
| L22 | S | t-butyl | t-butyl | L36 | S | t-butyl | t-butyl |

| | R | | R |
|---|---|---|---|
| L37 | phenyl | L41 | phenyl |
| L38 | methyl | L42 | methyl |
| L39 | t-butyl | L43 | t-butyl |
| L40 | mesityl | L44 | mesityl |

-continued

L45

L46

L47

L48

L49

L50

-continued

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 and references cited therein.

Examples of useful phosphorescent materials that can be used in light-emitting layers of this invention include, but are not limited to, those described in WO 00/57676; WO 00/70655; WO 01/41512 A1; WO 02/15645 A1; U.S. Patent Application Publication 2003/0017361 A1; WO 01/93642 A1; WO 01/39234 A2; U.S. Pat. No. 6,458,475; WO 02/071813 A1; U.S. Pat. No. 6,573,651; U.S. Patent Application Publication 2002/0197511 A1; WO 02/074015 A2; U.S. Pat. No. 6,451,455 B1; U.S. Patent Application Publications 2003/0072964 A1 and 2003/0068528 A1; U.S. Pat. Nos. 6,413,656, 6,515,298, 6,451,415, and 6,097,147; U.S. Patent Application Publications 2003/0124381 A1, 2003/0059646 A1, and 2003/0054198 A1; EP 1 239 526 A2; EP 1 238 981 A2; EP 1 244 155 A2; U.S. Patent Application Publications 2002/0100906 A1, 2003/0068526 A1, and 2003/0068535 A1; JP 2003/073387A; JP 2003/073388A; U.S. Patent Application Publications 2003/0141809 A1 and 2003/0040627 A1; JP 2003/059667A; JP 2003/073665A; and U.S. Patent Application Publication 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)Iridium(III) and bis(2-phenylpyridinato-N,$C^{2'}$)Iridium(III)(acetylacetonate), can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N, $C^{3'}$)Iridium(III)(acetylacetonate) and tris(1-phenylisoquinolinato-N,C)Iridium(III). A blue-emitting example is bis(2-(4,6-diflourophenyl)-pyridinato-N,$C^{2'}$)Iridium(III) (picolinate).

Red electrophosphorescence has been reported, using bis(2-(2'-benzo[4,5-a]thienyl)pyridinato-N, $C^{3'}$) iridium (acetylacetonate) [$Btp_2Ir(acac)$] as the phosphorescent material, in Adachi, C., Lamansky, S., Baldo, M. A., Kwong, R. C., Thompson, M. E., and Forrest, S. R., *App. Phys. Lett.*, 78, 1622–1624 (2001).

Still other examples of useful phosphorescent materials include coordination complexes of the trivalent lanthanides such as $Th^{3+}$ and $Eu^{3+}$ in J. Kido et al., *Appl. Phys. Lett.*, 65, 2124 (1994).

Preferred electron-transporting materials are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials. Related materials, denoted collectively as BAlq, can also be used as electron transporting materials. Bryan et al., in U.S. Pat. No. 5,141,671, discuss such materials. The BAlq compounds are mixed-ligand aluminum chelates, specifically bis($R_S$-8-quinolinolato)(phenolato)aluminum(III) chelates, where $R_S$ is a ring substituent of the 8-quinolinolato ring nucleus. These compounds are represented by the formula $(R_SQ)_2AlOL$, where Q represents a substituted 8-quinolinolato ligand, $R_S$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms. These materials also make effective hole- or excitonblocking layers for use with triplet emitting materials, as is known in the art.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

Figure 2:
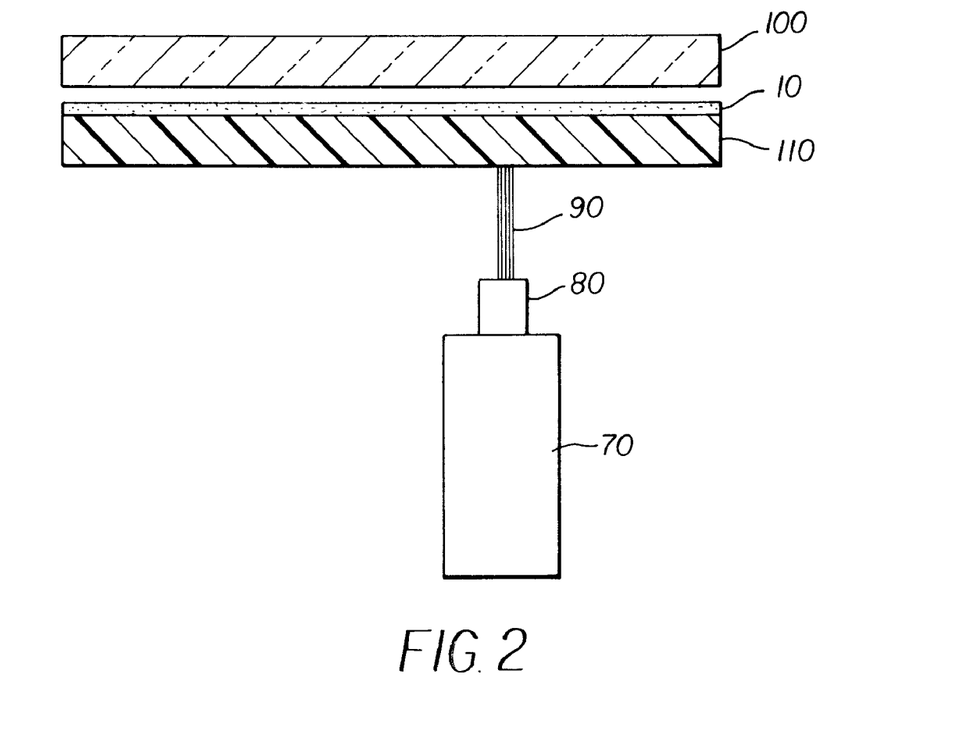
FIG. 2 shows a cross-sectional view of a laser radiation source irradiating a secured substrate/donor element combination using a donor element in accordance with this invention.

FIG. 2 shows a cross-sectional view of laser radiation source 70 irradiating a secured substrate/donor element combination with a laser light beam using a donor element in accordance with this invention. Donor element 10 is secured relative to substrate 100, that is, donor element 10 is placed in contact (not shown) with substrate 100, or is held with a controlled separation (shown) from substrate 100, and is held in position by e.g. pressurizing means 110 as taught by Phillips et al. in U.S. Patent Application Publication 2003/014870 A1. Laser radiation source 70 produces laser light that can be focused or modulated as necessary by illumination optics 80. Laser light beam 90 illuminates donor element 10 to cause the transfer of organic material to the appropriate portions of substrate 100, as described above. The transfer of organic material can be done under reduced pressure, e.g. a vacuum, or under atmospheric pressure, e.g. an inert atmosphere, as taught by Boroson et al. in U.S. Pat. Nos. 6,555,284 and 6,566,032.

Substrate 100 can be an organic solid, an inorganic solid, or include organic and inorganic solids that provides a surface for receiving the light-emitting material from a donor. Substrate 100 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 100 can be a homogeneous mixture of materials, a composite of materials, or multiple layers of materials. Substrate 100 can be an OLED substrate, that is a substrate commonly used for preparing OLED devices, e.g. active-matrix low-temperature polysilicon TFT substrate. The substrate 100 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light-absorbing or light reflective. Substrates for use in this case include, but are not limited to, glass, plastic, semiconductor materials, ceramics, and circuit board materials.

The invention and its advantages can be better appreciated by the following comparative examples.

Donor Element (Comparative)

A donor element for use in the comparative examples of OLED devices was constructed in the following manner:
1. An antireflection layer of 40 nm of silicon and an absorption layer of 40 nm of chromium, were vacuum-deposited in that order onto a 51 micron polyimide donor substrate; and
2. A mixed donor layer was formed over the thus prepared donor substrate by coevaporating 20 nm of 2-tert-butyl-9,10-bis(2-naphthyl)anthracene (TBADN) and 0.25 nm of tetra-tert-butyl-perylene (TBP) under vacuum from separate evaporating boats.

Donor Elements (Inventive)

A series of donor elements for use in the inventive examples of OLED devices was constructed as described above, except that step 1 was as follows:
1. An antireflection layer of 40 nm of silicon, an absorption layer of 40 nm of chromium, and a layer of aluminum were vacuum-deposited in that order onto a 51 micron polyimide donor substrate. The thickness of the aluminum layer was varied as described in the table below.

OLED Device Examples

OLED devices for both inventive and comparative examples were constructed in the following manner:
1. Onto a clean glass OLED substrate, a pattern of 40 to 80 nm transparent electrodes was produced by a standard photolithography process;
2. The resulting surface was treated with a plasma oxygen etch, followed by plasma deposition of ~0.1 nm of $CF_x$;
3. A 150 nm hole-transporting layer of 4,4'-bis[N-(1-naphthyl)-N-phenylamino]biphenyl (NPB) was vacuum deposited onto the surface;
4. A donor element prepared as described above was placed on top of the NPB layer and held in proximal contact using pressure as described by Phillips in U.S. Patent Application Publication 2003/014870 A1. A small gap of approximately one micron was maintained by the texture of the donor substrate. In regions of the OLED substrate in which emission is desired, transfer of the emissive material from the donor element was effected by irradiation through the polyimide substrate with an infrared linear laser light beam. The linear laser light beam has a full width at half maximum of 8.5 microns, 2.56 millimeter length, and a power of 10 watts. The beam was scanned in a direction perpendicular to the long dimension of the beam at a velocity of 650 mm/sec. The dwell time was 13 microseconds with an energy density of 0.3 $J/cm^2$;
5. A 30 nm electron-transporting layer of tris(8-hydroxyquinoline)aluminum (ALQ) was vacuum deposited onto the emissive layer;

6. A 0.5 nm electron-injecting layer of Lithium Fluoride (LiF) was vacuum deposited onto the electron-transporting layer; and
7. An electrode was formed over the electron-injecting layer by depositing 100 nm aluminum by vacuum deposition.

The lifetime was measured by putting a constant current of 80 mA/cm$^2$ through the constructed OLED device and monitoring the intensity of the light output with time. The blue dopant emission was detected by observing the emission spectra for the characteristic 3-peaked emission from TBP, with the strongest peak located at about 460 nm. The results are shown in Table 1.

TABLE 1

| Example # | Example Type | Aluminum Thickness (Å) | Relative Time to 50% Luminance |
|---|---|---|---|
| 1 | Comparative | 0 | 1.0 |
| 2 | Inventive | 50 | 1.2 |
| 3 | Inventive | 100 | 1.4 |
| 4 | Inventive | 400 | 1.3 |

The results demonstrate that the method of this invention produces OLED devices with a longer lifetime, where lifetime is defined as the time for the luminance to decrease to 50% of the initial value.

The invention has been described in detail with particular reference to certain preferred embodiments thereof, but it will be understood that variations and modifications can be effected within the spirit and scope of the invention.

PARTS LIST

| | |
|---|---|
| 10 | donor element |
| 20 | transparent support |
| 30 | antireflection layer |
| 40 | first metallic layer |
| 50 | second metallic layer |
| 60 | organic layer |
| 70 | laser radiation source |
| 80 | illumination optics |
| 90 | laser light beam |
| 100 | substrate |
| 110 | pressurizing means |

The invention claimed is:

1. A donor element for transferring organic material to form an OLED device, comprising:
   a) a transparent support;
   b) a first metallic layer responsive to radiation which passes through the transparent support to produce heat;
   c) a second metallic layer that is reactive to moisture or oxygen or both provided over the first metallic layer; and
   d) an organic layer having transferable organic material disposed over the second metallic layer which, in response to radiation absorbed by the first metallic layer, will cause the organic material to be transferred to an OLED device.

2. The donor element of claim 1 further including an antireflection layer disposed between the metallic layer and the transparent support.

3. The donor element of claim 2 wherein the antireflection layer includes silicon or Ge or mixtures thereof.

4. The donor element of claim 1 wherein the first metallic layer includes Ag, Au, Be, Co, Cr, Cu, Fe, Ir, Mo, Nb, Ni, Pt, Rh, Ta, Pd, V, or W, or mixtures thereof.

5. The donor element of claim 1 wherein the first metallic layer includes Be, Cr, V, Mo, Pt, or W, or mixtures thereof.

6. The donor element of claim 1 wherein the second metallic layer includes Al, Ba, Ca, Co, Cr, Fe, K, Li, Mg, Mn, Na, Ni, Sc, Sr, Ti, and V.

7. The donor element of claim 1 wherein the second metallic layer includes a metal with a first ionization potential of less than 7 eV.

8. The donor element of claim 2 wherein the antireflection layer includes silicon, the first metallic layer includes chromium, and the second metallic layer includes aluminum.

9. The donor element of claim 1 wherein the first metallic layer includes Ni and the antireflection layer includes Ge.

10. The donor element of claim 1 wherein the organic material includes two or more different organic materials.

11. The donor element of claim 1 wherein the transparent support is a plastic that is less than 200 micrometers thick.

12. The donor element of claim 10 wherein the transparent support is polyimide, polysulfone, polyetherimide, polyvinylidinefluoride or polymethylpentene, or mixtures thereof.

* * * * *